(12) United States Patent
Murase et al.

(10) Patent No.: US 6,344,255 B1
(45) Date of Patent: Feb. 5, 2002

(54) RADIO WAVE TRANSMITTING MATERIAL

(75) Inventors: Taku Murase; Naoyoshi Sato; Hiroshi Kurihara; Toshifumi Saitoh; Motonari Yanagawa, all of Tokyo; Kozo Hayashi; Kyoichi Fujimoto, both of Kakamigahara, all of (JP)

(73) Assignees: TDK Corporation, Tokyo; Tokiwa Electric Co., Kakamigahara, both of (JP)

( * ) Notice: Subject to any disclaimer, the term of this patent is extended or adjusted under 35 U.S.C. 154(b) by 0 days.

(21) Appl. No.: 09/383,190

(22) Filed: Aug. 26, 1999

(30) Foreign Application Priority Data

Aug. 28, 1998 (JP) ............................................ 10-259299

(51) Int. Cl.$^7$ ................................................. B32B 3/12
(52) U.S. Cl. ......................... 428/116; 428/73; 156/253; 156/250; 156/60
(58) Field of Search ........................... 428/116, 73, 117, 428/118; 156/60, 61, 250, 252, 253

(56) References Cited

U.S. PATENT DOCUMENTS 5,594,218 A    1/1997   Diaz et al.
5,688,348 A   11/1997   Diaz et al.

FOREIGN PATENT DOCUMENTS

| DE | 38 06 319 | 9/1989 |
|----|-----------|--------|
| FR | 2 660 787 | 10/1991 |
| JP | 7-357     | 1/1995 |

OTHER PUBLICATIONS

Patent Abstracts of Japan, vol. 1995, No. 11, Dec. 26, 1995, JP 07 205349, Aug. 8, 1995.

*Primary Examiner*—Deborah Jones
*Assistant Examiner*—Wendy Boss
(74) *Attorney, Agent, or Firm*—Oblon, Spivak, McClelland, Maier & Neustadt, P.C.

(57) ABSTRACT

There is disclosed a radio wave transmitting material, in which to opposite surfaces of a honeycomb structure obtained by laminating incombustible sheets prepared from a slurry containing a main component of an inorganic hydrate compound into a honeycomb shape using an inorganic adhesive, incombustible boards prepared from the slurry containing the main component of the inorganic hydrate compound are integrally bonded using an adhesive, whereby a radio wave transmitting material lightweight and superior in incombustibility and radio wave transmittance is realized.

23 Claims, 5 Drawing Sheets

RADIO WAVE TRANSMITTING MATERIAL

BACKGROUND OF THE INVENTION (i) Field of the Invention

The present invention relates to a radio wave transmitting material, particularly to a radio wave transmitting material which is mounted on a front surface of a radio wave absorbent material for use in a radio wave absorptive wall, and the like.

(ii) Description of the Related Art

Recently, toward the realization of a high information society, the application of radio waves has been rapidly enlarged centering on a mobile communication field. Moreover, with an innovative progress of today's microelectronics technique, various electronic apparatuses have been prevalent. However, with the development of such information communication technique, the influence of unnecessary electromagnetic noises exerted onto precision apparatus associated devices has raised problems.

For the measurement of electromagnetic noises, a radio wave dark room (anechoic room) where there is no reflection of electromagnetic waves is used, and a radio wave absorbent material is used in an inner wall of the radio wave dark room. Examples of the radio wave absorbent material for use in the radio wave dark room include a radio wave absorbent material which is constituted of foamed styrene, foamed urethane, or another organic material and which has a square pole shape, or a wedge shape.

However, since the radio wave absorbent material is blended with carbon black, and the like to obtain a conductivity, the radio wave dark room provides a dark and oppressed feeling inside. Moreover, since an apex of the radio wave absorbent material in the shape of the square pole or the wedge is relatively brittle, there is a problem that the material is easily broken by collision, and the like. Furthermore, with an increase of radio wave troubles, an immunity test and another large-power test are turned to a direction in which they are obliged to be performed. In the radio wave dark room which is used in a closed state, from the viewpoint of an enhanced safety, incombustible materials are requested to be used.

To solve the problems, apex sites (front surfaces) of a multiplicity of arranged radio wave absorbent materials are covered with a white radio wave transmitting material which is lightweight and which has a property of transmitting radio waves. However, in the conventional radio wave transmitting material, a foamed board of foamed styrene and another plastic is used, but these are not incombustible materials.

Moreover, as the radio wave transmitting material provided with incombustibility, a foamed board of calcium carbonate, and a nonwoven board of ceramic fiber are developed. However, the former is in a quasi-incombustible level, and is insufficient from the viewpoint of safety. Moreover, the latter is superior in incombustibility but expensive, which has a problem that a reduction of manufacture costs of the radio wave dark room is hindered.

SUMMARY OF THE INVENTION

An object of the present invention is to provide a radio wave transmitting material to be mounted on a front surface of a radio wave absorbent material for use in a radio wave dark room, a radio wave absorptive wall, and the like, which is lightweight and superior in incombustibility and radio wave transmittance.

To attain this and other objects, according to the present invention there is provided a radio wave transmitting material which comprises a honeycomb structure, and incombustible boards bonded integrally to opposite surfaces of the honeycomb structure using an adhesive. The honeycomb structure is formed by laminating incombustible sheets prepared from a slurry containing a main component of an inorganic hydrate compound into a honeycomb shape using an inorganic adhesive, and the incombustible boards are prepared from the slurry containing the main component of the inorganic hydrate compound.

In the present invention, the honeycomb structure is lightweight but provides superior incombustibility and radio wave transmittance, and the incombustible board imparts a superior mechanical strength and incombustibility to the radio wave transmitting material. Therefore, the radio wave transmitting material of the present invention is lightweight and is provided with the superior incombustibility and radio wave transmittance. Moreover, the radio wave transmitting material is also excellent in mechanical strength, and can protect a plurality of radio wave absorbent materials arranged in the radio wave dark room, and the like without generating any radio wave reflection. Furthermore, since the incombustible board has a white color, no oppressed feeling is provided inside the radio wave dark room.

DETAILED DESCRIPTION OF THE PREFERRED EMBODIMENTS

Embodiments of the present invention will be described hereinafter.

Figure 1:
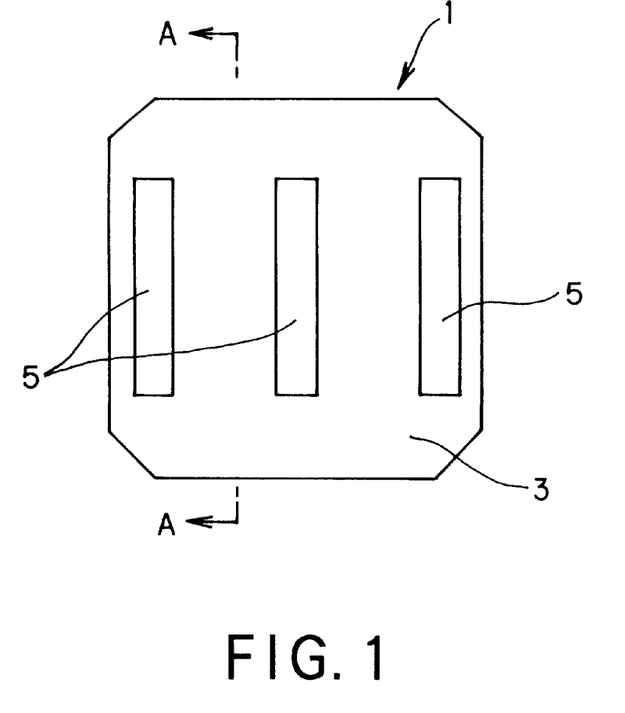
FIG. 1 is a plan view showing one embodiment of a radio wave transmitting material of the present invention.
Figure 2:
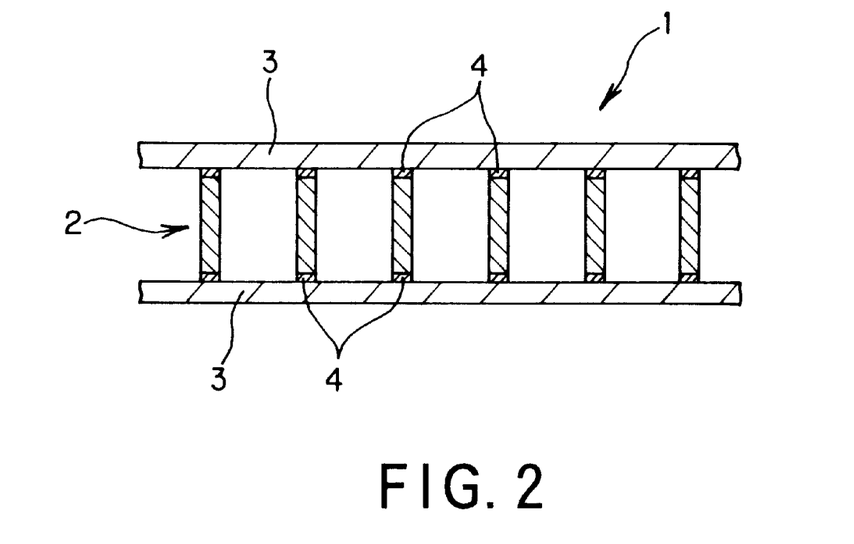
FIG. 2 is a partial enlarged sectional view seen along arrows A—A of the radio wave transmitting material shown in FIG. 1.
Figure 3:
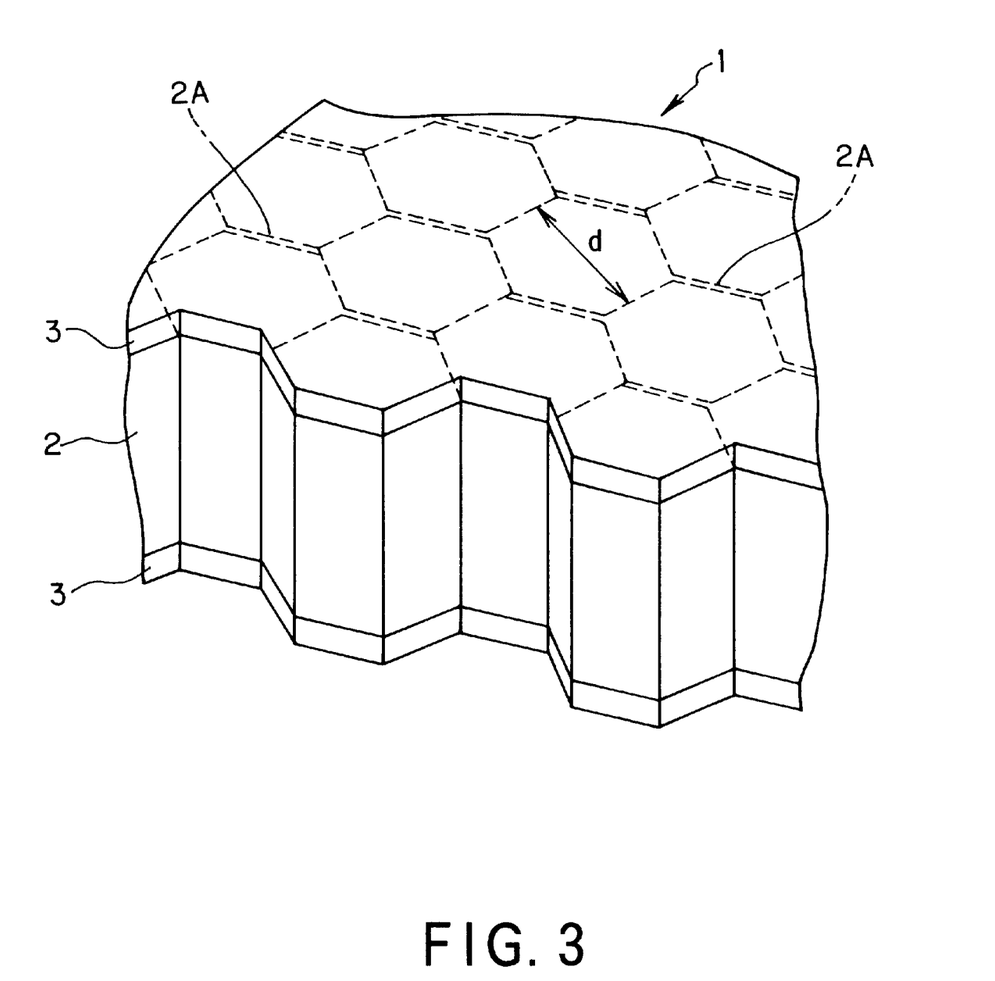
FIG. 3 is a partial enlarged perspective view of the radio wave transmitting material shown in FIG. 1.

FIG. 1 is a plan view showing one embodiment of a radio wave transmitting material of the present invention, FIG. 2 is a partial enlarged sectional view seen along arrows A—A of the radio wave transmitting material shown in FIG. 1, and FIG. 3 is a partial enlarged perspective view of the radio wave transmitting material shown in FIG. 1. In FIGS. 1 to 3, a radio wave transmitting material 1 of the present invention comprises a honeycomb structure 2, and incombustible boards 3 integrally bonded to opposite surfaces of the honeycomb structure 2 using an adhesive 4. In the example shown in the drawing, the radio wave transmitting material 1 is provided with three concave portions 5 for engaging with a part of the radio wave absorbent material.

Figure 4:
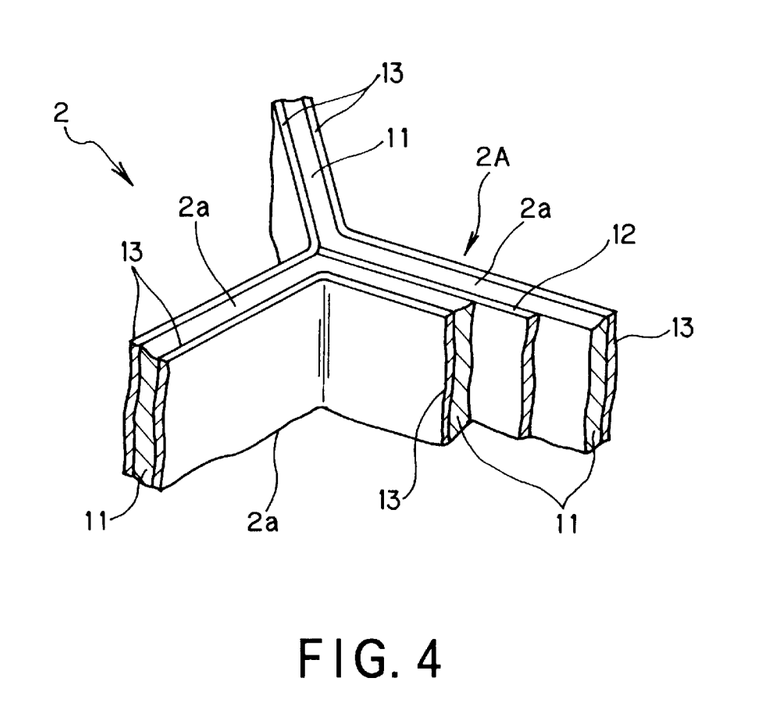
FIG. 4 is a partial enlarged perspective view of a honeycomb structure constituting the radio wave transmitting material shown in FIG. 1.

For the honeycomb structure 2 constituting the radio wave transmitting material 1, incombustible sheets prepared from a slurry containing a main component of an inorganic hydrate compound are laminated into a honeycomb shape using an inorganic adhesive. FIG. 4 is a partial enlarged perspective view of the honeycomb structure 2. In FIG. 4, the honeycomb structure 2 is a laminate in which incombustible sheets 11 are bonded to one another via an inorganic adhesive 12, and in the example shown in the drawing, inorganic impregnating agent layers 13 are formed on opposite surfaces of each incombustible sheet 11.

The slurry for preparing the incombustible sheet 11 contains 60 to 90 wt % of, for example, sepiolite as the inorganic hydrate compound, further contains binders, and may also contain a glass fiber as a reinforcing material. The binders for use are a thermoplastic resin for enhancing a strength of the incombustible sheet, and a thermoset resin having a net-like three-dimensional structure to provide cohesiveness and water resistance. As the thermoplastic resin, polyacrylamide (a molecular weight of about 800,000 to 1,000,000) or another anionic thermoplastic resin can be used, and as the thermoset resin, polyamide polyamine epichlorhydrin or another cationic thermoset resin can be used. The slurry is used to form the sheet in a preparing process, the sheet is dried at a predetermined temperature, and moisture evaporation and binder reaction proceed to set the sheet, so that the incombustible sheet 11 is obtained. A thickness of the incombustible sheet 11 is preferably set in the range of 0.2 to 0.7 mm.

To prepare the honeycomb structure 2 using the incombustible sheet 11, first, the inorganic adhesive is linearly applied at predetermined intervals in a length direction of the incombustible sheet 11 having a predetermined width, additionally linear application positions of the inorganic adhesive are deviated by a half pitch between adjoining incombustible sheets, and a predetermined number of incombustible sheets 11 are laminated. Subsequently, the laminate is pressed and bonded at inorganic adhesive applied sites to form a sheet block. Here, an application width of the inorganic adhesive corresponds to a length of a superposing surface 2A of cells of the honeycomb structure 2, and by adjusting a width and forming interval of the inorganic adhesive layer 12, a cell size d (refer to FIG. 3) can be controlled. Subsequently, after the sheet block is cut to a desired dimension of the honeycomb structure, and immersed in an inorganic impregnating agent, the inorganic impregnating agent is dried/set to form the inorganic impregnating agent layer 13, so that the honeycomb structure 2 as shown in FIG. 4 is obtained. As the inorganic adhesive for use, for example, a water-soluble type or a water-dispersion type is exemplified in which a hardener, a catalyst, and the like are mixed in aluminum phosphate solution, colloidal silica, colloidal alumina, and the like. Moreover, as the inorganic impregnating agent, various inorganic adhesives can be used, but the same adhesive as the inorganic adhesive for bonding the incombustible sheets 11 is preferably used.

In consideration of the formation of the concave portions 5 for engaging with a part of the radio wave absorbent material, the cell size d of the honeycomb structure 2 is set in the range of 10 to 60 mm. When the cell size d is less than 10 mm, the cell size is little opened, radio waves may be reflected dependent on the frequency, and a weight increase of the radio wave transmitting material 1 by an increase of the number of cells is unfavorably caused. On the other hand, when the cell size d exceeds 60 mm, the radio wave absorbent material, which is engaged in the concave portions 5 so as to be oblique relative to the incombustible board 3 of the radio wave transmitting material 1, has a deteriorated stability. A height of the honeycomb structure 2 can be set in the range of 20 to 60 mm, and a thickness of the cell superposing surface 2A can be set in the range of 0.4 to 2.0 mm.

Figure 5:
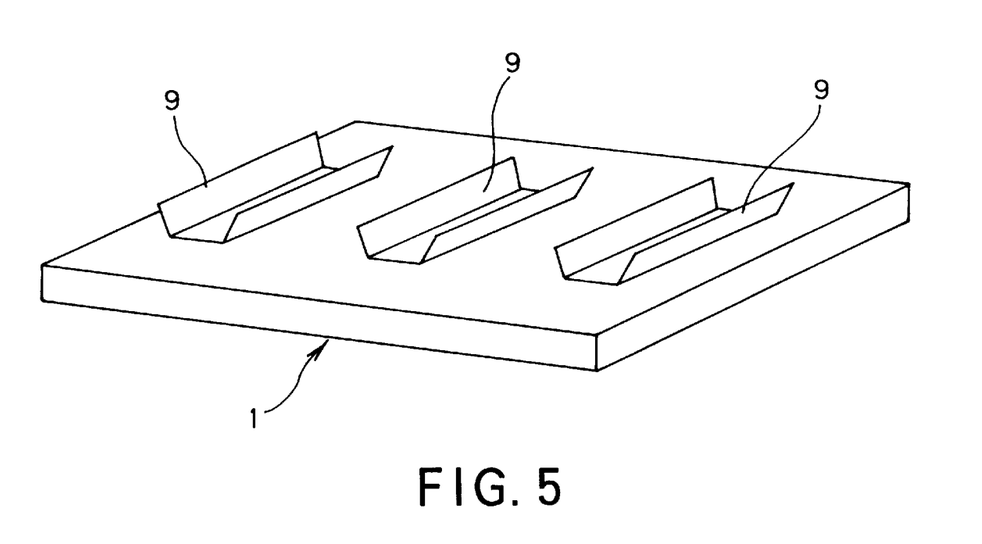
FIG. 5 is a perspective view showing another embodiment of the radio wave transmitting material of the present invention.

Additionally, even when the honeycomb structure is provided with no concave portion for engaging with a part of the radio wave absorbent material, the cell size d is preferably set in the range of 10 to 60 mm, and the height of the honeycomb structure 2 can be set in the range of 4 to 60 mm. Moreover, to engage with a part of the radio wave absorbent material, instead of the concave portions, for example, connecting members 9 may be applied onto the radio wave transmitting material 1 as shown in FIG. 5.

The incombustible board 3 constituting the radio wave transmitting material 1 is prepared from the slurry which contains a main component of an inorganic hydrate compound. The incombustible board 3 can be prepared in the same manner as the incombustible sheet 11, and as the inorganic hydrate compound, for example, sepiolite can be used. Moreover, a plurality of incombustible boards formed in the preparing process may be bonded together with the inorganic adhesive to form the incombustible board 3. A thickness of the incombustible board 3 is preferably in the range of 0.2 to 3.0 mm, and the incombustible boards 3 different in thickness from each other may be bonded to opposite surfaces of the honeycomb structure 2. Additionally, the incombustible board 3 may have a embossed/processed surface (on the side opposite to the bonding surface with the honeycomb structure 2). The embossing processing can be performed in a pressure bonding process when a plurality of incombustible boards formed in the preparing process are applied to one another. By applying the embossing processing, the surface of the radio wave transmitting material 1 can beautifully be finished.

The integral bonding of the incombustible board 3 onto the honeycomb structure 2 can be performed by applying together the honeycomb structure 2 and the incombustible board 3 with the adhesive 4. The adhesive 4 for use may be either inorganic or organic, the inorganic adhesive is more advantageous in respect of the incombustibility, and the organic adhesive is more advantageous in respect of the strength. As the inorganic adhesive, various inorganic adhesives can be exemplified, but the same adhesive as the inorganic adhesive for bonding the incombustible sheets 11 is preferably used. The inorganic adhesive can be applied to both end surfaces 2a of the honeycomb structure 2 by roller application, and the like. Moreover, as the organic adhesive, for example, an adhesive of epoxy resin can be used.

The concave portions 5 constituting the radio wave transmitting material 1 are formed like grooves in one surface of the radio wave transmitting material 1. Dimensions, shapes, and number of the concave portions 5 are not limited, and can appropriately be set in accordance with the radio wave absorbent material on the front surface of which the radio wave transmitting material 1 is provided.

For the radio wave transmitting material 1 of the present invention, since the honeycomb structure 2 is constituted of an inorganic hydrate compound having flexibility, bending strength is high, and the honeycomb structure can be prepared by extension. Examples of the inorganic hydrate compound of the present invention include the above-described sepiolite, aluminum hydroxide, magnesium hydroxide, calcium hydroxide and other hydrates, gypsum dihydrate, calcium aluminate, wollastonite, and the like. Among these, sepiolite is especially preferable. By the incombustibility owned by the inorganic hydrate compound such as sepiolite which is a mineral fiber, and the like, and the thermal stability of the inorganic adhesive for bonding the incombustible sheets, the honeycomb structure 2 has a superior incombustibility. Moreover, since the inorganic impregnating agent layer 13 is formed on the surface of the incombustible sheet 11 of the honeycomb structure 2, the surface strength of the incombustible sheet 11 is enhanced, and fibers can be prevented from fluffing and peeling off. Furthermore, the incombustible board 3 has a superior incombustibility, and the incombustible board 3 enhances a transverse strength of the honeycomb structure 2. Then, since the sepiolite which is an inorganic hydrate compound is an inexpensive material, the radio wave transmitting material 1 can be manufactured at low costs. Moreover, the radio wave transmitting material 1 of the present invention has a dry specific weight of 0.05 to 0.3 $g/cm^3$, and even as compared with the conventional foamed resin type of the radio wave transmitting material, it has no particular problem in respect of weight reduction.

Additionally, for the radio wave transmitting material of the present invention, an inorganic coating agent may be applied to at least a part of the surface. The inorganic coating agent which has been heretofore used as the inorganic coating agent having incombustibility or flame retardancy can be used, and is not particularly limited. Examples thereof include alkylsilicate as a main agent, water for hydrolyzing the alkylsilicate, alkynium chelate as a reaction catalyst to promote the hydrolytic reaction, methyl acid phosphate as a reaction inhibitor to inhibit the hydrolytic reaction, and another inorganic coating agent which contains alcohol as a solvent to dissolve the alkylsilicate and water. Moreover, the inorganic coating agent may contain sepiolite dispersed in the alcohol as the solvent, or may further contain carbon graphite, and the like. As the alkylsilicate, for example, methyltrimethoxysilane, phenyltrimethoxysilane, or the like can be used. Furthermore, a water system inorganic coating agent may be used. By using the inorganic coating agent to form a film, a surface filling-up effect and mechanical strength can further be enhanced.

Figure 6:
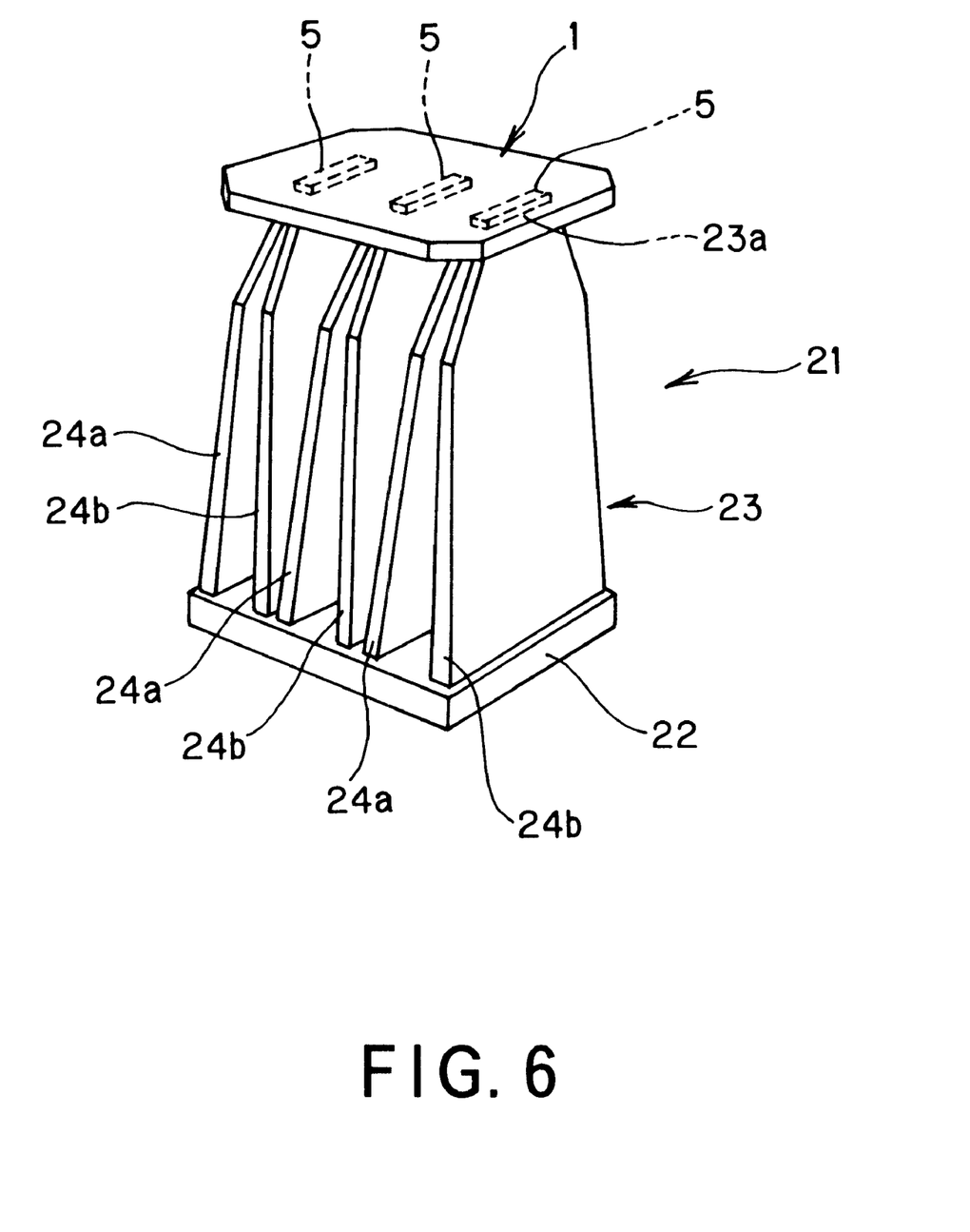
FIG. 6 is a perspective view showing one example of a radio wave absorbent material to which the radio wave transmitting material of the present invention is attached.

FIG. 6 is a perspective view showing an example in which the radio wave transmitting material of the present invention is attached to the front surface of the radio wave absorbent material. In FIG. 6, a radio wave absorbent unit 21 is provided with three sets of wedge-shaped radio wave absorbent materials 23 on a base material 22 in which foamed styrene, and the like contain carbon black, and the like. Each wedge-shaped radio wave absorbent material 23 is constituted of a pair of plate-like radio wave absorbent materials 24-a, 24b in which foamed styrene, and the like contain carbon black, and the like. A plurality of the radio wave absorbent units 21 can be provided by fixing the base material 22 to the inner wall of the radio wave dark room via a shield panel, a ferrite radio wave absorbent material, or the like. Then, the radio wave transmitting material 1 of the present invention is attached to the front surface of one radio wave absorbent unit 21 in such a manner that a tip-end apex portion 23a of each wedge-shaped radio wave absorbent material 23 is engaged in the concave portion. Additionally, in the concave portion, the radio wave transmitting material 1 and the radio wave absorbent material 23 may be bonded to each other by the adhesive.

Concrete embodiments will next be described to further detail the present invention.

Preparation of Sample 1

First, a slurry for an incombustible sheet having the following composition was prepared using Henschel mixer.

Composition of Slurry for Incombustible Sheet sepiolite... 85 parts by weight
   (Aid Plus manufactured by Mizusawa Kagaku Kogyo Kabushiki Kaisha)
glass fiber... 10 parts by weight
   (manufactured by Nitto Boseki Co., Ltd.)
organic binder... 5 parts by weight Subsequently, the slurry was used to prepare the incombustible sheet (thickness of 0.25 mm). Subsequently, the incombustible sheet and inorganic adhesive (mixture of potassium silicate and antimony pentoxide) were used to prepare a honeycomb structure as shown in FIG. 4 (515 mm×515 mm×41 mm). A cell size of the honeycomb structure was set to 10 mm. Moreover, the inorganic adhesive was used as an inorganic impregnating agent, and an inorganic impregnating agent layer was formed on the incombustible sheet.

Furthermore, the incombustible sheets were laminated with the inorganic adhesive, and a 1.5 mm thick incombustible board A and 0.5 mm thick incombustible board B (515 mm×515 mm) were manufactured.

Subsequently, the inorganic adhesive was applied to a surface of the honeycomb structure by roller application, the incombustible board A was applied to one surface, the incombustible board B was applied to the other surface, and drying was performed at 150° C. for one hour, so that a radio wave transmitting material of 515 mm×515 mm×43 mm having a sectional structure shown in FIG. 2 was prepared. A punching processing was performed on the radio wave transmitting material to form a 41 mm deep concave portion having an opening of 60 mm×200 mm at an interval of 137.5 mm in three places, so that the radio wave transmitting material as shown in FIG. 1 (sample 1) was prepared.

Preparation of Sample 2

A radio wave transmitting material (sample 2) as shown in FIG. 1 was prepared in the same manner as the sample 1 except that the cell size of the honeycomb structure was set to 20 mm.

Preparation of Sample 3

A radio wave transmitting material (sample 3) as shown in FIG. 1 was prepared in the same manner as the sample 1 except that the cell size of the honeycomb structure was set to 30 mm.

Preparation of Sample 4

A radio wave transmitting material (sample 4) as shown in FIG. 1 was prepared in the same manner as the sample 1 except that the cell size of the honeycomb structure was set to 40 mm.

Preparation of Sample 5

A radio wave transmitting material (sample 5) as shown in FIG. 1 was prepared in the same manner as the sample 1 except that the cell size of the honeycomb structure was set to 60 mm.

Preparation of Sample 6

A radio wave transmitting material (sample 6) as shown in FIG. 1 was prepared in the same manner as the sample 1 except that the cell size of the honeycomb structure was set to 5 mm.

Preparation of Sample 7

A radio wave transmitting material (sample 7) as shown in FIG. 1 was prepared in the same manner as the sample 1 except that the cell size of the honeycomb structure was set to 80 mm.

Preparation of Sample 8

A board of foamed styrene (515 mm×515 mm×43 mm) was prepared, the board was punched/processed, and a 41 mm deep concave portion having an opening of 60 mm×200 mm was formed at an interval of 137.5 mm in three places, so that a radio wave transmitting material (sample 8) was prepared.

Evaluation of Radio Wave Transmitting Material

For the radio wave transmitting materials (samples 1 to 8) prepared as described above, the dry specific gravity was measured, the incombustibility was measured by the following measuring method, and results are shown-in the following Table 1.

Incombustibility Test

In conformity with a test method of an incombustible material provided in Notification No. 1828 of the Ministry of Construction, first an inorganic adhesive (FJ294 manufactured by Tokiwa Electric Co.) was used to laminate radio wave transmitting materials, a test piece of 40 mm×40 mm×50 mm was prepared, the test piece was heated at 750±10° C. in a furnace for 20 minutes, and a temperature rise of the test piece by the heating was measured. When the temperature rise of the test piece by the heating is less than 50° C., the incombustibility stands the test.

Figure 7:
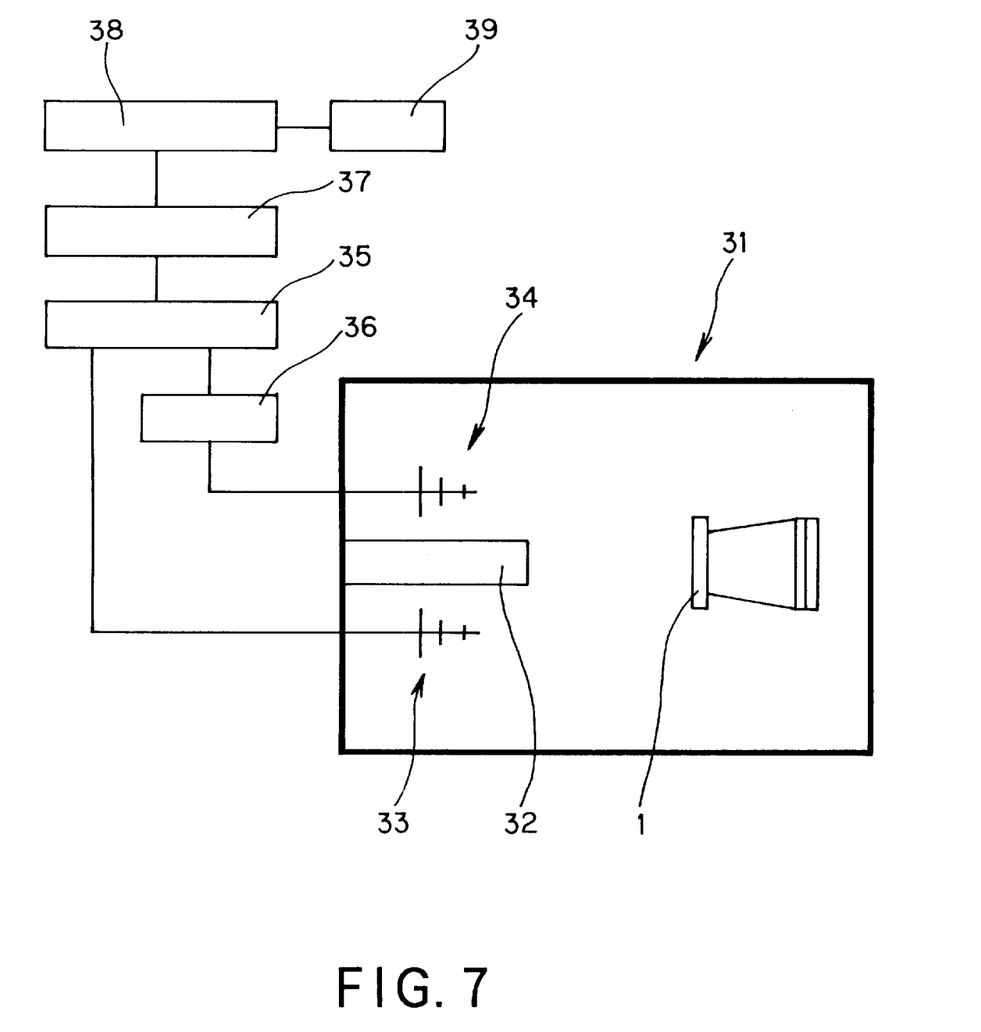
FIG. 7 is a block diagram of a measuring system for measuring a radio wave absorbing power of the radio wave absorbent material in 1 GHz in the embodiment.

Subsequently, on a base material (ferrite IB-011 (thickness of 5.9 mm) manufactured by TDK Co.) with a shield panel disposed on a back surface thereof, using IP-090BL manufactured by TDK Co., Ltd. as a radio wave absorbent material, three wedge-shaped radio wave absorbent materials were provided as shown in FIG. 6, so that a radio wave absorbent unit was prepared. Each radio wave transmitting material (samples 1 to 8) was attached to a front surface of the radio wave absorbent material of the radio wave absorbent unit, and a radio wave absorbing power in 1 GHz was measured. Specifically, in a radio wave dark room 31 as shown in a measuring system block diagram of FIG. 7, radio waves were radiated to the radio wave transmitting material 1 attached to the front surface of the radio wave absorbent unit, and a reflective wave level was measured. In the radio wave dark room 31, a transmission antenna 33 and a reception antenna 34 are arranged via a screen 32, the transmission antenna 33 is connected to S-parameter 35, and the reception antenna 34 is connected to the S-parameter 35 via RF amplifier 36. Moreover, the S-parameter 35 is connected to a measurement controller 38 via a network analyzer 37, and the measurement controller 38 is connected to a printer 39. A reflectivity (dB) of the radio wave absorbent unit to which each radio wave transmitting material (samples 1 to 8) was attached was calculated from the following equation on the basis of a reflection level only of a metal plate which has the same dimension as a bottom surface (base material) of the radio wave absorbent unit.

Reflectivity (dB)=(Reflection Level(dB) of Radio Wave Absorbent Unit)−(Reflection Level(dB) of Metal Plate)

TABLE 1

| Radio Wave Transmitting Material | Cell Size (mm) | Specific Gravity (g/cm³) | Incombustibility | Reflectivity (dB) |
|---|---|---|---|---|
| Sample 1 | 10 | 0.17 | Excellent (788° C.) | −21 |
| Sample 2 | 20 | 0.11 | excellent (776° C.) | −27 |
| Sample 3 | 30 | 0.08 | excellent (771° C.) | −28 |
| Sample 4 | 40 | 0.05 | excellent (764° C.) | −30 |
| Sample 5 | 60 | 0.02 | excellent (761° C.) | −30 |
| Sample 6 | 5 | 0.25 | excellent (792° C.) | −17 |
| Sample 7 | 80 | 0.02 | excellent (761° C.) | −30 |
| Sample 8 | — | 0.05 | improper | −30 |

In parentheses of a column of incombustibility evaluation, a temperature of the test piece by heating is shown.

As shown in Table 1, the samples 1 to 5 are lightweight and have superior incombustibility, and it has been confirmed that the radio wave absorbent material with each of these radio wave transmitting materials attached thereto, in the same manner as a case where the radio wave transmitting material formed of the conventional foamed styrene board (sample 8) is used, satisfies standards as the radio wave dark room. On the other hand, the sample 6 has a slightly large specific gravity, and the radio wave absorbing power of the radio wave absorbent material with the sample attached thereto is low. Therefore, it has been confirmed that the sample is slightly inferior in the radio wave transmittance to the samples 1 to 5. The sample 7 is lightweight and has a superior incombustibility. Additionally, it has been confirmed that the radio wave absorbent material with the sample attached thereto provides the same level of radio wave absorbing power as when the radio wave transmitting material (sample 8) formed of the conventional foamed styrene board is used, but mounting stability to the radio wave absorbent material is slightly low.

Additionally, it has been confirmed again that the radio wave transmitting material (sample 8) formed of the conventional foamed styrene board is vastly inferior in the incombustibility.

What is claimed is:

1. A radio wave transmitting material comprising a honeycomb structure, and incombustible boards bonded integrally to opposite surfaces of the honeycomb structure using an adhesive, said honeycomb structure being formed by laminating incombustible sheets prepared from a slurry comprising an inorganic hydrate compound into a honeycomb shape using an inorganic adhesive, said incombustible boards being prepared from the slurry comprising the inorganic hydrate compound, wherein said honeycomb structure has a cell size in the range of 10 to 60 mm.

2. The radio wave transmitting material according to claim 1, wherein said inorganic hydrate compound is sepiolite.

3. The radio wave transmitting material according to claim 1, wherein a surface of said incombustible board is subjected to an embossing processing.

4. The radio wave transmitting material according to claim 1, wherein the radio wave transmitting material comprises a concave portion for engaging with a part of a radio wave absorbent material.

5. The radio wave transmitting material according to claim 1, wherein a thickness of said incombustible sheet is in the range of 0.2 to 0.7 mm.

6. The radio wave transmitting material according to claim 1, wherein a height of said honeycomb structure is in the range of 4 to 60 mm.

7. The radio wave transmitting material according to claim 1, wherein a thickness of said incombustible board is in the range of 0.2 to 3.0 mm.

8. The radio wave transmitting material according to claim 1, wherein a dry specific gravity of the radio wave transmitting material is in the range of 0.05 to 0.3 g/cm³.

9. The radio wave transmitting material according to claim 4, wherein a height of said honeycomb structure is in the range of 20 to 60 mm.

10. The radio wave transmitting material of claim 1, wherein the slurry further comprises a binder and/or a reinforcing material.

11. The radio wave transmitting material of claim 10, wherein the binder is a thermoplastic resin or a thermosetting resin.

12. The radio wave transmitting material of claim 10, wherein the reinforcing material is glass fiber.

13. The radio wave transmitting material of claim 11, wherein the thermoplastic resin is a polyacrylmide or an anionic thermoplastic resin.

14. The radio wave transmitting material of claim 11, wherein the thermosetting resin is polyamide polyamine epichlorohydrin or a cationic thermoset resin.

15. The radio wave transmitting material of claim 1, wherein the inorganic hydrate compound is selected from the group consisting of sepiolite, aluminum hydroxide, magnesium hydroxide, calcium hydroxide, gypsum dihydrate, calcium aluminate, and wollastonite.

16. The radio wave transmitting material of claim 1 further comprising an inorganic coating applied to at least a part of the surface thereof.

17. The radio wave transmitting material of claim 16, wherein the inorganic coating comprises a hydrolyzed alkylsilicate.

18. The radio wave transmitting material of claim 17, wherein the alkylsilicate is methyltrimethoxysilane and/or phenyltrimethoxysilane.

19. The radio wave transmitting material of claim 1, further comprising connecting means for engaging with a radio wave absorbent material.

20. The radio wave transmitting material of claim 1 attached to a radio wave absorbing material.

21. A radio wave absorbent unit comprising a wedge-shaped radio wave absorbent material and the radio wave transmitting material of claim 1, having a concave portion attached to the apex of the radio wave absorbing material.

22. A method of preparing the radio wave transmitting material of claim 1, comprising:

forming an incombustible sheet from a slurry of an inorganic hydrate compound;

applying an inorganic adhesive at intervals on the incombustible sheet;

laminating at least two incombustible sheets having an inorganic adhesive applied thereto;

pressing and bonding said laminated sheets to form a sheet block;

cutting the sheet block to form a honeycomb structure;

forming an incombustible board from the slurry of the inorganic hydrate compound; and bonding an incombustible board to opposite surfaces of the honeycomb structure.

23. The method of claim 22, wherein after forming the honeycomb structure, the honeycomb structure is immersed in an inorganic impregnating agent to form an inorganic impregnating agent layer thereon.

* * * * *